US010535786B2

(12) United States Patent
Yashiki et al.

(10) Patent No.: US 10,535,786 B2
(45) Date of Patent: Jan. 14, 2020

(54) PHOTODETECTOR HAVING ONE-DIMENSIONAL GRATING STRUCTURE

(71) Applicant: Photonics Electronics Technology Research Association, Tokyo (JP)

(72) Inventors: Kenichiro Yashiki, Tokyo (JP); Jun Ushida, Tokyo (JP); Masatoshi Tokushima, Tokyo (JP); Kazuhiko Kurata, Tokyo (JP)

(73) Assignee: PHOTONICS ELECTRONICS TECHNOLOGY RESEARCH ASSOCIATION, Tokyo (JP)

(*) Notice: Subject to any disclaimer, the term of this patent is extended or adjusted under 35 U.S.C. 154(b) by 0 days.

(21) Appl. No.: 15/536,533

(22) PCT Filed: Dec. 16, 2015

(86) PCT No.: PCT/JP2015/085186

§ 371 (c)(1),
(2) Date: Jun. 15, 2017

(87) PCT Pub. No.: WO2016/098803

PCT Pub. Date: Jun. 23, 2016

(65) Prior Publication Data

US 2017/0345952 A1 Nov. 30, 2017

(30) Foreign Application Priority Data

Dec. 16, 2014 (JP) ................................ 2014-253810

(51) Int. Cl.

| | |
|---|---|
| ***H01L 31/0232*** | (2014.01) |
| ***G02B 6/12*** | (2006.01) |
| ***G02B 6/26*** | (2006.01) |
| ***H01L 31/107*** | (2006.01) |
| *G02B 6/124* | (2006.01) |

(52) U.S. Cl.

CPC .......... *H01L 31/02327* (2013.01); *G02B 6/12* (2013.01); *G02B 6/26* (2013.01);

(Continued)

(58) Field of Classification Search

None

See application file for complete search history.

(56) References Cited

U.S. PATENT DOCUMENTS

| | | | |
|---|---|---|---|
| 5,229,614 A | 7/1993 | Andersson et al. | |
| 2002/0000244 A1* | 1/2002 | Zaidi ................ | H01L 31/02363 136/259 |

(Continued)

FOREIGN PATENT DOCUMENTS

| | | |
|---|---|---|
| JP | H01-136380 A | 5/1989 |
| JP | H05-118915 A | 5/1993 |
| JP | 2007-273832 A | 10/2007 |

OTHER PUBLICATIONS https://www.thesaurus.com/browse/absorb (Year: 2018).*

(Continued)

*Primary Examiner* — Nilufa Rahim

(74) *Attorney, Agent, or Firm* — Michael Best & Friedrich LLP

(57) ABSTRACT

Provided is a light receiving element with high light receiving sensitivity.

The light receiving element comprises: a light absorbing layer that absorbs light to generate a carrier; and a diffraction element that converts the optical path of first polarized light, which is obliquely incident on a plane formed by the light absorbing layer, so that the first polarized light propagates in a first direction along the light absorbing layer, and that converts the optical path of second polarized light incident from the same direction as the first polarized light so that the second polarized light propagates in a second direction, opposite the first direction, along the light absorbing layer.

8 Claims, 9 Drawing Sheets

(52) U.S. Cl.
CPC .......... *H01L 31/1075* (2013.01); *G02B 6/124* (2013.01); *G02B 2006/12126* (2013.01)

(56) References Cited

U.S. PATENT DOCUMENTS

| | | | | |
|---|---|---|---|---|
| 2010/0322555 | A1* | 12/2010 | Vermeulen ......... | G02B 6/12007 385/28 |
| 2013/0038932 | A1* | 2/2013 | Bovino .................. | G02B 26/06 359/484.01 |
| 2015/0129023 | A1* | 5/2015 | Kuan .................. | H01L 31/1844 136/255 |
| 2015/0131942 | A1* | 5/2015 | Xu ........................... | G02B 6/34 385/37 |

OTHER PUBLICATIONS

Taillaert, “2D grating fiber coupler used as polarization splitter,” Photonics Research Group, Ghent University, <URL:http://www.photonics.intec.ugent.be/research/topics.asp?ID=82, retrieved Nov. 7, 2014.
De Dobbelaere, “Hybrid Silicon Photonics for High-Speed Optical Interconnect”, Luxtera http://www.semiconwest.org/sites/semoconwest.org/files/data14/docs/SW2014_Peter%20De%20Dobbelaere%20_Luxtera_For%20posting.pdf, Jul. 2014.
Noguchi et al., “Study on Vertically-Illuminated PIN Ge Photodiode,” Proceedings of the 61st Japan Society of Applied Physics, Spring Meeting, Spring 2014, 19p-F8-6.
International Search Report issued in PCT/JP2015/085186, dated Mar. 1, 2016.

* cited by examiner

PHOTODETECTOR HAVING ONE-DIMENSIONAL GRATING STRUCTURE

TECHNICAL FIELD

The present invention relates to a light receiving element.

BACKGROUND ART

In recent years, in the field of Si (silicon) photonics, it is reported that light from an SMF (single mode fiber) is guided into an Si waveguide via the coupling by use of a grating coupler, and then received by a waveguide-based PD (photodetector). Utilizing a grating coupler enables optical path conversion and the coupling into a waveguide; however, an SMF is required as input elements for coupling with a single-mode waveguide. Note that an example of this type of an optical receiver is disclosed in non-patent-related document 2, where a TE mode and a TM mode are separated from each other by use of a two-dimensional grating, thereby coupling the two modes with a PD.

Meanwhile, a surface-type detector comprising Ge (Germanium) is also reported in the field of Si photonics.

In optical interconnection, an MMF (multimode fiber), which has a large core-diameter, is used for realizing low-cost optical transmission. Compared to an SMF, an MMF provides larger assembly tolerance with respect to a light source, thus reducing of costs can be realized. Meanwhile, in order for a PD to receive light from an MMF at low costs, a surface-type detector having a large light-receiving area is used.

CITATION LIST

Non-Patent-Related Documents

Non-patent-related Document 1: Dirk Taillaert, “2D grating fiber coupler used as polarization splitter,” [online], [retrieved on Nov. 7, 2014], the Internet [URL: http://www.photonics.intec.ugent.be/research/topic.asp?ID=85)

Non-patent-related Document 2: Peter De Dobbelaere, “Hybrid Silicon Photonics for High-Speed Optical Interconnect,” [online], [retrieved on Dec. 11, 2014], the Internet [URL: http://www.semiconwest.org/sites/semiconwest.org/files/data14/docs/SW2014_Peter %20De %20Dobbelaere%20_Luxtera_For%20posting.pdf]

Non-patent-related Document 3: Masataka Noguchi et al, Proceedings of the 61st JSAP (The Japan Society of Applied Physics) Spring Meeting, 19p-F8-6

SUMMARY OF INVENTION

Technical Problem

As described above, since an optical receiver of such type that light from an SMF is received by a waveguide-based PD via a grating coupler provides low assembly tolerance due to the use of the SMF, there is a problem relating to reducing of costs. Further, in the case of a two-dimensional grating such as that described in non-patent-related document 1, two gratings are formed corresponding to two kinds of polarized waves, in such a manner that they cross with each other; and, since the two gratings are formed to cross with each other, there is also a problem that diffraction efficiency for each of the polarized waves is lowered. On the other hand, a surface-type Ge detector is effective for reducing costs since it can be used with an MMF; however, there is a problem that sensitivity of the surface-type PD is low, since the distance in an absorbing layer thereof through which light passes is shorter than that of a waveguide-based PD. Further, as described in non-patent-related document 3, if the thickness of Ge as an absorbing layer is made thicker, there are problems that a carrier drift band is deteriorated and a photodetector band is deteriorated. Thus, it is necessary to form a thin Ge layer for achieving a high-speed operation of the photodetector.

The low sensitivity of an optical receiver implies low photoelectric conversion efficiency; thus, there arises a problem that a link loss budget in optical interconnection cannot be sufficiently secured. Particularly, in Si photonics, where it is effective for reducing electric power consumption to divide light from a light source for parallel transmission, it is desirable to make the minimum receiving power of an optical receiver smaller.

In view of the matters described above, the present invention is achieved; and one of the objects of the present invention is to provide a light receiving element with high light receiving sensitivity.

Solution to Problem

In order to solve the problems described above, a light receiving element according to an embodiment of the present invention comprises: a light absorbing layer for absorbing light to generate carriers; and a diffraction element for converting an optical path of first polarized light that is incident in a slanted direction relative to a plane formed by the light absorbing layer, such that the first polarized light propagates along the light absorbing layer toward a first direction, and for converting an optical path of second polarized light that is incident from the same direction as the first polarized light and is orthogonally polarized relative to the first polarized light, such that the second polarized light propagates along the light absorbing layer toward a second direction that is opposite to the first direction.

Another embodiment of the present invention comprises the above embodiment, wherein the following formula $$K=(\beta_1+\beta_2)/(m+n)$$

is satisfied, where K denotes the magnitude of a reciprocal lattice vector of the diffraction element, $\beta_1$ denotes a propagation constant of the first polarized light in the light absorbing layer, $\beta_2$ denotes a propagation constant of the second polarized light in the light absorbing layer, m (a positive integer) denotes a diffraction order of the first polarized light diffracted by the diffraction element, and n (a positive integer) denotes a diffraction order of the second polarized light diffracted by the diffraction element.

A further embodiment of the present invention comprises the above embodiment, wherein the magnitude of the reciprocal lattice vector of the diffraction element is equal to an average value of the propagation constant of the first polarized light in the light absorbing layer and the propagation constant of the second polarized light in the light absorbing layer.

A still further embodiment of the present invention comprises the above embodiment, wherein the diffraction element is formed in the light absorbing layer.

A still further embodiment of the present invention comprises the above embodiment, wherein the diffraction element is formed on the same plane as the light absorbing layer, wherein the region in which the diffraction element is formed is different from the region in which the light absorbing layer is formed.

A still further embodiment of the present invention comprises the above embodiment, wherein the light absorbing layer comprises a first light absorbing layer for absorbing the first polarized light propagating toward the first direction, and a second light absorbing layer for absorbing the second polarized light propagating toward the second direction.

A still further embodiment of the present invention comprises the above embodiment, and further comprises an optical waveguide that stands slantedly with respect to a plane constituted by the light absorbing layer, for guiding the first polarized light and the second polarized light into the diffraction element.

A still further embodiment of the present invention comprises the above embodiment, wherein the optical waveguide is slanted with respect to the plane constituted by the light absorbing layer such that an incident angle θ of the first polarized light and the second polarized light onto the diffraction element satisfies the following formula $$\theta = \sin^{-1}[(m \cdot n_{eff2} - n \cdot n_{eff1})/((m+n) \cdot n_w)],$$

where $n_{eff1}$ denotes an effective refractive index of the light absorbing layer with respect to the first polarized light, $n_{eff2}$ denotes an effective refractive index of the light absorbing layer with respect to the second polarized light, and $n_w$ denotes an effective refractive index of the optical waveguide.

Advantageous Effects of Invention

According to the present invention, light receiving sensitivity of the light receiving element can be improved.

DESCRIPTION OF EMBODIMENTS

Embodiments of the present invention will be described in detail below with reference to the drawings.

First Embodiment

Figure 1:
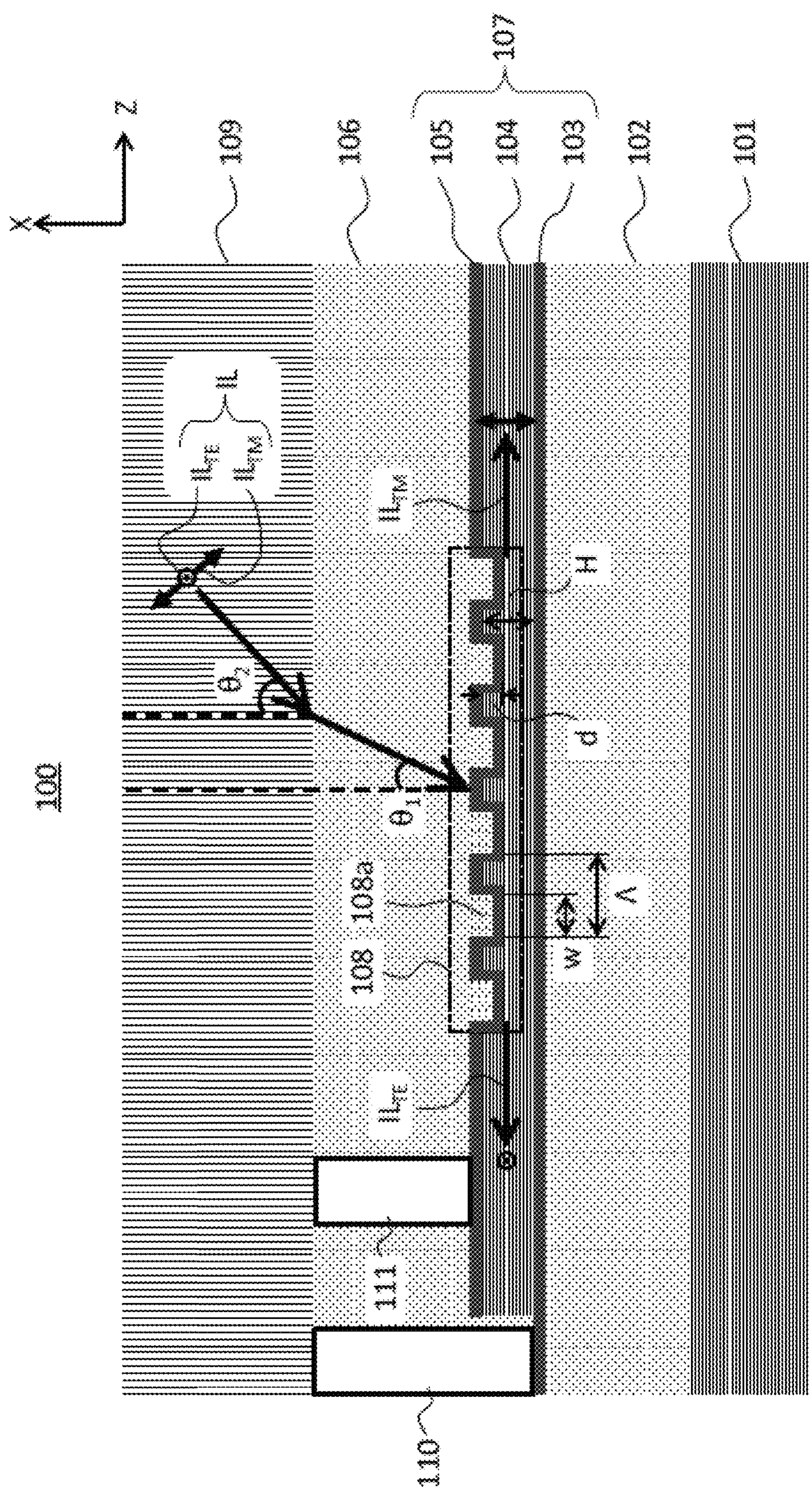
FIG. 1 is a cross-sectional view showing a structure of a light receiving element according to a first embodiment of the present invention.

FIG. 1 is a cross-sectional view showing a structure of a light receiving element 100 according to a first embodiment of the present invention. The light receiving element 100 comprises a substrate 101, a lower $SiO_2$ layer 102, a P-type semiconductor layer 103, a light absorbing layer 104, an N-type semiconductor layer 105, and an upper $SiO_2$ layer 106. The lower $SiO_2$ layer 102, the P-type semiconductor layer 103, the light absorbing layer 104, the N-type semiconductor layer 105, and the upper $SiO_2$ layer 106 are laminated on the substrate 101 in this order from the substrate 101 side. In FIG. 1, an X axis is defined to be in the perpendicular direction relative to the surface of the substrate 101, and a Z axis is defined to be in the parallel direction (the lateral direction in the figure) relative to the surface of the substrate 101.

By way of example, the substrate 101 is a silicon (Si) substrate. The P-type semiconductor layer 103 is a semiconductor layer that is doped with a P-type impurity. For example, the P-type semiconductor layer 103 comprises a thin-film silicon layer that is doped with boron (B) as a P-type impurity. The light absorbing layer 104 is an I-type (intrinsic) semiconductor layer, which is not doped with any impurity. For example, the light absorbing layer 104 comprises a germanium (Ge) layer. The N-type semiconductor layer 105 is a semiconductor layer that is doped with an N-type impurity. For example, the N-type semiconductor layer 103 comprises a thin-film silicon layer that is doped with phosphorus (P) or arsenic (As) as an N-type impurity. Thus, the light receiving element 100 comprises a PIN structure 107 comprising the P-type semiconductor layer 103, the light absorbing layer 104, and the N-type semiconductor layer 105. Note that each of the P-type semiconductor layer 103 and the N-type semiconductor layer 105 may be a layer comprising the same semiconductor as the light absorbing layer 104 (for example, germanium), each doped with a P-type impurity or an N-type impurity, respectively. In FIG. 1, the P-type semiconductor layer 103 is shown to be formed on the substrate 101 side, and the N-type semiconductor layer 105 is shown to be formed on the opposite side of the substrate 101; however, the layers 103 and 105 may be reversely positioned. That is, the N-type semiconductor layer 105 may be formed on the substrate 101 side, and the P-type semiconductor layer 103 may be formed on the opposite side of the substrate 101.

The lower $SiO_2$ layer 102 is a layer comprising silicon dioxide ($SiO_2$) that is formed adjacent to and below the PIN structure 107, i.e., at the substrate 101 side. The upper $SiO_2$ layer 106 is a layer comprising silicon dioxide that is formed adjacent to and above the PIN structure 107, i.e., at the opposite side of the substrate 101. The lower $SiO_2$ layer 102 and the upper $SiO_2$ layer 106 have refractive indices lower than that of the light absorbing layer 104 at the sensitivity wavelength of the light receiving element 100. Accordingly, a slab waveguide is formed that comprises the light absorbing layer 104 (or the PIN structure 107 comprising the P-type semiconductor layer 103, the light absorbing layer 104, and the N-type semiconductor layer 105) having a high refractive index, as a core layer, and, the lower $SiO_2$ layer 102 and the upper $SiO_2$ layer 106 having a low refractive index, as a lower cladding layer and an upper cladding layer, respectively.

A portion of the light receiving element 100, that comprises the substrate 101, the lower $SiO_2$ layer 102, and the P-type semiconductor layer 103, may also be formed by use of an SOI (Silicon On Insulator) substrate comprising a BOX layer (a buried oxide layer) and an SOI layer on the BOX layer. That is, the BOX layer of the SOI substrate may be used as the lower $SiO_2$ layer 102, and the SOI layer of the SOI substrate may be used to form the P-type semiconductor layer 103.

The light absorbing layer 104 comprises a grating (a diffraction element) 108. The grating 108 is an uneven structure wherein the thickness of the light absorbing layer 104 periodically changes along the Z-axis direction. More specifically, a plurality of grooves 108*a*, each having a depth d and a width w, are formed on the surface of the light absorbing layer 104, at the upper $SiO_2$ layer 106 side, in such a manner that the grooves 108*a* are aligned with a pitch (a periodicity) $\Lambda$ along the Z-axis direction. In other words, the light absorbing layer 104 comprises an uneven structure wherein the portions having thickness H and the portions having the thickness H−d that correspond to the grooves 108*a* are alternatively arranged in the Z-axis direction. The width of each of the portions having thickness H along the Z-axis direction is $\Lambda$−w, and the width of each of the portions having thickness H−d along the Z-axis direction is w. This uneven structure constitutes the grating 108. In FIG. 1, the N-type semiconductor layer 105 is also formed on the side surfaces of the uneven structure, in addition to the bottom surfaces of the concave portions and the top surfaces of the convex portions of the grating 108. It is effective to have this structure in the case that photocurrent flows across the concave and the convex portions. In the case that photocurrent do not need to flow across the concave and the convex portions, the N-type semiconductor layer 105 may be formed only on the bottom surfaces of the concave portions and the top surfaces of the convex portions, as is the structure shown in FIG. 9 that will be discussed later. Further, although it is not shown in any drawings, the N-type semiconductor layer 105 may be formed only on the bottom surfaces of the concave portions or only on the top surfaces of the convex portions.

Next, an operation of the light receiving element 100 will be described. From an air layer 109 above the upper $SiO_2$ layer 106, incident light IL enters the upper $SiO_2$ layer 106 with an incident angle of $\theta_2$. The incident light IL comprises TE-polarized incident light $IL_{TE}$ and TM-polarized incident light $IL_{TM}$. The incident light IL into the upper $SiO_2$ layer 106 is refracted at a boundary surface between the air layer 109 and the upper $SiO_2$ layer 106 to propagate through the upper $SiO_2$ layer 106, and enters the grating 108 with an incident angle of $\theta_1$. Note that, although the incident light IL is drawn as a single line in FIG. 1, the incident light IL may have a width corresponding to the size of the grating 108; this is because an incident position of the incident light IL may be any position from which the incident light IL can enter the grating 108.

The TE-polarized incident light $IL_{TE}$ entering the grating 108 is diffracted toward a −Z direction by the grating 108. That is, the propagation direction of the TE-polarized incident light $IL_{TE}$ after diffraction is the −Z direction. The TE-polarized incident light $IL_{TE}$ diffracted by the grating 108 is coupled with TE-polarized propagation-mode light in the light absorbing layer 104 (or a slab waveguide comprising the light absorbing layer 104 as a core layer) to propagate toward the −Z direction through the light absorbing layer 104. Meanwhile, the TM-polarized incident light $IL_{TM}$ entering the grating 108 is diffracted toward a +Z direction by the grating 108. That is, the propagation direction of the TM-polarized incident light $IL_{TM}$ after diffraction is the +Z direction. The TM-polarized incident light $IL_{TM}$ diffracted by the grating 108 is coupled with TM-polarized propagation-mode light in the light absorbing layer 104 (or the slab waveguide comprising the light absorbing layer 104 as the core layer) to propagate toward the +Z direction through the light absorbing layer 104.

Thus, the diffracted light from the TE-polarized incident light $IL_{TE}$ and the diffracted light from the TM-polarized incident light $IL_{TM}$ propagate within the surfaces of the light absorbing layer 104 toward the −Z direction and the +Z direction, respectively, and accordingly, they are absorbed by the light absorbing layer 104 while propagation. In response to the absorption of light, carriers (electrons and holes) are generated in the light absorbing layer 104. By applying a reverse bias voltage to the PIN structure 107, current corresponding to the generated carriers is extracted from the light receiving element 100 via a P-electrode 110 and an N-electrode 111.

As described above, the light receiving element 100 is a surface-type light receiving element having a structure where light is incident from the upper side onto an area of the surface of the light absorbing layer 104. However, the light entering the light absorbing layer 104 does not pass through the light absorbing layer 104 along the direction of its thickness, and instead, the light is diffracted by the grating 108 such that both the TE-polarized and the TM-polarized light propagate within the surfaces of the light absorbing layer 104 toward specific directions that are parallel to the light absorbing layer 104 and are opposite to each other. Thus, the length for interaction between the light and the light absorbing layer 104 is made longer, and thereby carriers can be generated at high efficiency from both the TE-polarized and the TM-polarized light. As a result, the light receiving sensitivity, i.e., photoelectric conversion efficiency, of the light receiving element 100 can be improved. Since the grating 108 is formed to have a one-dimensional structure (i.e., along the Z-axis direction) rather than a two-dimensional structure such as that disclosed in non-patent-related Document 1, it is capable of diffracting efficiently both of the two types of the polarized light, i.e., the TE-polarized and the TM-polarized, and accordingly, photoelectric conversion efficiency of the light receiving element 100 can be improved.

Next, conditions that allow the TE-polarized incident light and the TM-polarized incident light to be diffracted by the grating 108 toward the directions parallel to the light absorbing layer 104 and opposite to each other, will be described. Note that, in the descriptions below, the magnitude of any arbitrary vector A, i.e., |A|, may be denoted simply as "A" for convenience.

Figure 2:
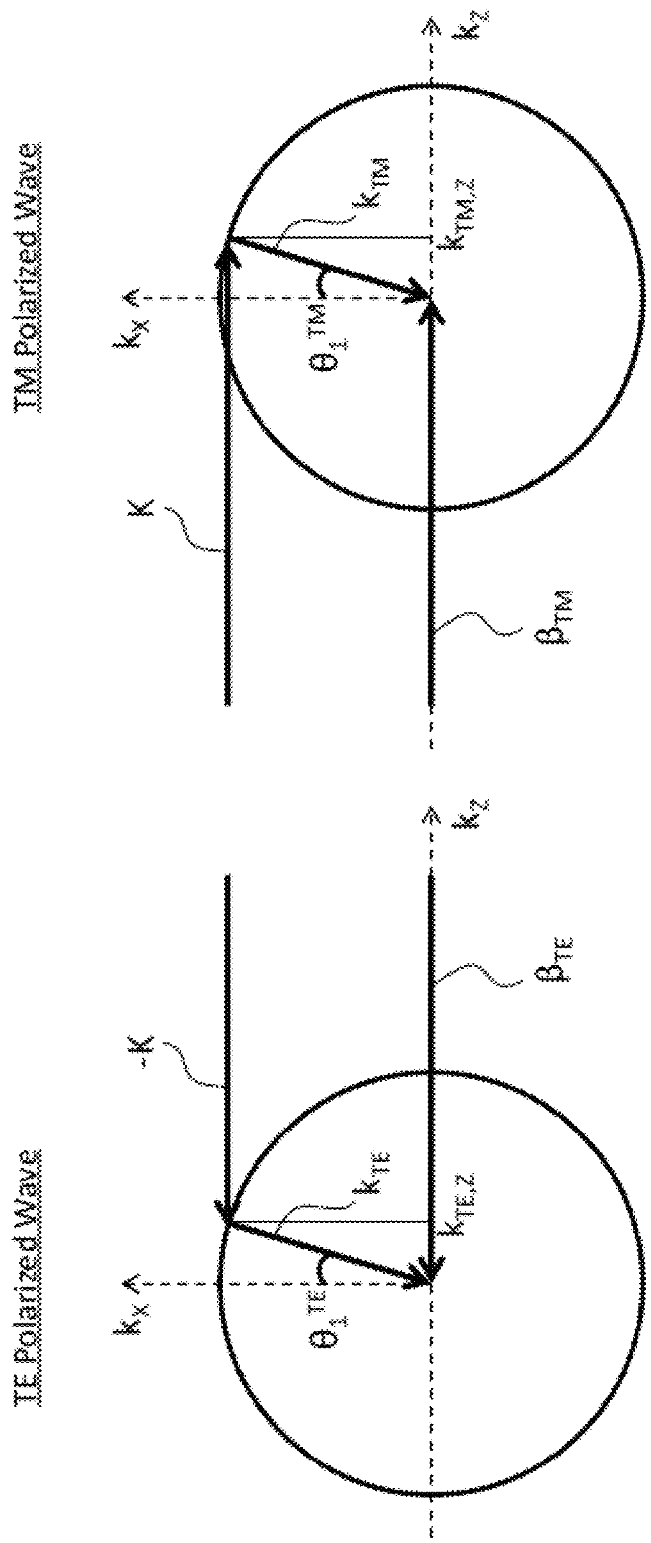
FIG. 2 shows a conservation law of wavenumber in the diffraction by a grating.

FIG. 2 shows a conservation law of wavenumber in the diffraction by the grating 108. In FIG. 2, a vector K represents a reciprocal lattice vector of the grating 108. The magnitude of the reciprocal lattice vector K is as follows: $|K|=2\pi/\Lambda$. The direction of the reciprocal lattice vector K that effects on the TE-polarized incident light is the −Z direction. The direction of the reciprocal lattice vector K that effects on the TM-polarized incident light is the +Z direction. Vectors $k_{TE}$ and $k_{TM}$ represent wavenumber vectors of the TE-polarized incident light and the TM-polarized incident light in the upper $SiO_2$ layer 106, respectively. Let $\lambda$ be the wavelength of the incident light and $n_{SiO2}$ be the refractive index of the upper $SiO_2$ layer 106, then the magnitudes of the wavenumber vectors $k_{TE}$ and $k_{TM}$ are as follows: $k=|k_{TE}|=|k_{TM}|=(2\pi/\Lambda)\cdot n_{SiO2}$. The direction of each of the wavenumber vectors $k_{TE}$ and $k_{TM}$ is defined in accordance with the incident angle of the respective polarized incident light relative to the grating 108. Let $\theta_1^{TE}$ be the incident angle of the TE-polarized incident light and $\theta_1^{TM}$ be the incident angle of the TM-polarized incident light, then the Z component $k_{TE,Z}$ for the wavenumber vector $k_{TE}$ and the Z component $k_{TM,Z}$ for the wavenumber vector $k_{TM}$ are given as $k_{TE,Z}=k\cdot\sin\theta_1^{TE}$ and $k_{TM,Z}=k\cdot\sin\theta_1^{TM}$, respectively.

Further, in FIG. 2, the vector $\beta_{TE}$ is a vector that is oriented toward the propagation direction of the TE-polarized propagation-mode light propagating through the light absorbing layer 104 (i.e., the −Z direction), and has the magnitude equal to the propagation constant of the TE-polarized propagation-mode light. Let $n_{eff}^{TE}$ be the effective refractive index of the light absorbing layer 104 with respect to the TE-polarized propagation-mode light, then the propagation constant of the TE-polarized propagation-mode light is represented as follows: $|\beta_{TE}|s=(2\pi/\Lambda)\cdot n_{eff}^{TE}$. The vector $\beta_{TM}$ is a vector that is oriented toward the propagation direction of the TM-polarized propagation-mode light propagating through the light absorbing layer 104 (i.e., the +Z direction), and has the magnitude equal to the propagation constant of the TM-polarized propagation-mode light. Let $n_{eff}^{TM}$ be the effective refractive index of the light absorbing layer 104 with respect to the TM-polarized propagation-mode light, then the propagation constant of the TM-polarized propagation-mode light is represented as follows: $|\beta_{TM}|=(2\pi/\Lambda)\cdot n_{eff}^{TM}$. The refractive index of a semiconductor (for example, germanium) constituting the light absorbing layer 104 is larger than the refractive index $n_{SiO2}$ for the upper $SiO_2$ layer 106 and, thus, $n_{eff}^{TE}>n_{SiO2}$ and $n_{eff}^{TM}>n_{SiO2}$; accordingly, the magnitude of each of the vectors $\beta_{TE}$ and $\beta_{TM}$ is larger than the magnitude k for the wavenumber vector of the incident light.

As shown in FIG. 2, with regard to diffraction by a grating, the following conservation law of wavenumber is generally established in the $k_Z$ direction in a wavenumber space that corresponds to a reciprocal lattice vector of the grating:

$$k_Z=-|\beta-N\cdot K| \quad (1),$$

where, $k_Z$ denotes a Z component of a wavenumber vector of the incident light, β denotes a propagation constant of the diffracted light from the grating, K denotes the magnitude of the reciprocal lattice vector of the grating, and N denotes a positive integer. FIG. 2 illustrates first-order diffraction (i.e., N=1) performed by the grating 108; and in this case, according to the formula (1), the condition for allowing the first-order diffraction is that the following formulas (2a) and (2b) are satisfied in relation to the TE-polarized wave and the TM-polarized wave, respectively:

$$k_{TE,Z}=-\beta_{TE}+K(<0) \quad (2a)$$

$$k_{TM,Z}=-K+\beta_{TM}(<0) \quad (2b),$$

where, $\beta_{TE}$ and $\beta_{TM}$ denote propagation constants of the TE-polarized propagation-mode light and the TM-polarized propagation-mode light in the light absorbing layer 104, respectively.

The formula (2a) tells that the TE-polarized incident light, with an incident angle $\theta_1^{TE}$ such that the Z component of the wavenumber vector satisfies $k_{TE,Z}=-\beta_{TE}+K$, is diffracted toward the −Z direction by the grating 108. Similarly, the formula (2b) tells that the TM-polarized incident light, with an incident angle $\theta_1^{TM}$ such that the Z component of the wavenumber vector satisfies $k_{TM,Z}=-K+\beta_{TM}$, is diffracted toward the +Z direction by the grating 108. Thus, if $k_{TE,Z}=k_{TM,Z}$, i.e., the following formula (3) can be held, the TE-polarized incident light and the TM-polarized incident light from the same direction will be diffracted toward the −Z direction and the +Z direction, respectively:

$$K=(\beta_{TE}+\beta_{TM})/2 \quad (3).$$

In this case, the incident angle $\theta_1^{TE}$ (=$\theta_1^{TM}$) of the incident light IL is given as follows:

$$\begin{aligned}\theta_1^{TE} &= \sin^{-1}(k_{TE,Z}/k) \\ &= \sin^{-1}[(\beta_{TM}-\beta_{TE})/(2\cdot k)] \\ &= \sin^{-1}[(n_{eff}^{TM}-n_{eff}^{TE})/(2\cdot n_{SiO2})].\end{aligned} \quad (3)'$$

The incident angle of the incident light IL entering the light receiving element 100 from an actual MMF (multi-mode fiber) varies and spreads, and, thus, some angular components cannot be completely coupled with the slab waveguide (the light absorbing layer 104) by the grating 108. However, these angular components are diffracted by the grating 108 to angles that are substantially parallel to the slab waveguide. Therefore, even when an MMF is used at an input of the light receiving element 100, the above-described angular components of the incident light propagate toward the directions that are substantially parallel to the light absorbing layer 104. Thus, compared with a prior-art light receiving element without gratings, the distance along which the above component travels within the light absorbing layer is made longer, which contributes to an increase in the amount of absorption of light in the light absorbing layer 104, i.e., contributes to enhancement of the sensitivity of the light receiving element 100.

Figure 3:
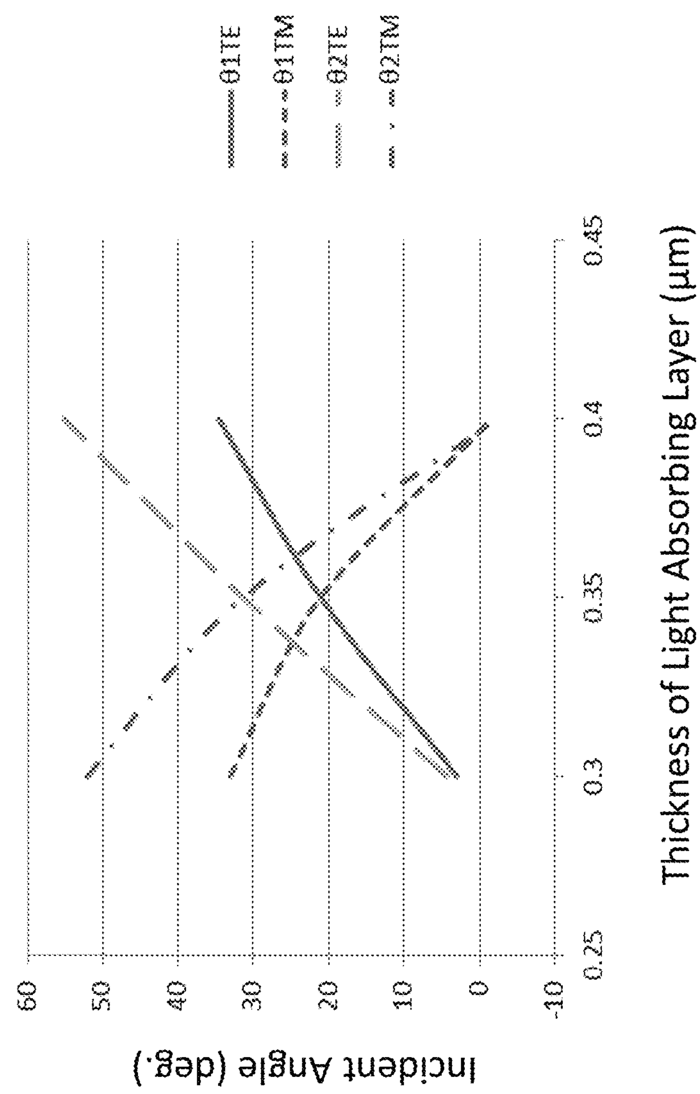
FIG. 3 is a graph showing relationship between the thicknesses H of a light absorbing layer (corresponding to the horizontal axis) and incident angles of TE-polarized incident light and TM-polarized incident light that satisfy formulas (2a) and (2b), respectively (corresponding to the vertical axis).

Next, a specific structure of the light receiving element 100 for satisfying the diffraction condition formula (3) will be explained. FIG. 3 is a graph showing relationship between the thickness H of the light absorbing layer 104 (corresponding to the horizontal axis) and incident angles of the TE-polarized incident light and the TM-polarized incident light that satisfy the above formulas (2a) and (2b), respectively (corresponding to the vertical axis), where it is supposed that the structural parameters of the grating 108, specifically, the pitch Λ (=2π/K), the depth d, and the filling rate w/Λ, are fixed. Under such supposition, when the thickness H of the light absorbing layer 104 as a high refractive index material becomes thicker, the effective refractive indices $n_{eff}^{TE}$ and $n_{eff}^{TM}$ of the light absorbing layer 104 with respect to the TE-polarized propagation-mode light and the TM-polarized propagation-mode light will increase, and, accordingly, the propagation constant $\beta_{TE}$ of the TE-polarized propagation-mode light and the propagation constant $\beta_{TM}$ of the TM-polarized propagation-mode light will also increase.

Then, regarding the TE-polarized wave, where the right side of the formula (2a) is negative, the absolute value thereof will increase and therefore the absolute value of the Z component $k_{TE,Z}$ of the wavenumber vector of the incident light will also increase. Referring to FIG. 2, the increase in the propagation constant makes the vector $\beta_{TE}$ longer, and the magnitude K of the reciprocal lattice vector is fixed; thus, $\theta_1^{TE}$ becomes larger. In this manner, as the thickness H of the light absorbing layer 104 increases, the incident angle $\theta_1^{TE}$ of the TE-polarized incident light such as that diffracted toward the −Z direction by the grating 108 becomes larger. Meanwhile, regarding the TM-polarized wave, where the right side of the formula (2b) is negative, the absolute value thereof will decrease and therefore the absolute value of the Z component $k_{TM,Z}$ of the wavenumber vector of the incident light will also decrease. Referring to FIG. 2, the increase in the propagation constant makes the vector $\beta_{TM}$ longer, and the magnitude K of the reciprocal lattice vector is fixed; thus, $\theta_1^{TM}$ becomes smaller. In this manner, as the thickness H of the light absorbing layer 104 increases, the incident angle $\theta_1^{TM}$ of the TM-polarized incident light such as that diffracted toward the +Z direction by the grating 108 becomes smaller.

Thus, as shown in FIG. 3, for a particular thickness of the light absorbing layer 104 (0.35 μm in the example shown in FIG. 3), the incident angles $\theta_1^{TE}$ and $\theta_1^{TM}$ that satisfy the diffraction conditions for the respective polarized waves will coincide with each other. That is, by setting the thickness H of the light absorbing layer 104 to such a specific thickness, the TE-polarized incident light and the TM-polarized incident light entering from the same direction can be diffracted toward the −Z direction and the +Z direction, respectively. This corresponds to adjusting the thickness H of the light absorbing layer 104 to make the right side of the formula (3) to be equal to a fixed value of the left side of the formula (3). Note that, in the example shown in FIG. 3, Λ=0.568 μm, d=0.1 μm, w=0.284 μm, $n_{SiO2}$=1.45, and the refractive index of the whole PIN structure 107 including the light absorbing layer 104 is set to 4.2.

In this manner, by fixing Λ, d, and w/Λ and adjusting the thickness H of the light absorbing layer 104, the light receiving element 100 satisfying the diffraction condition formula (3) can be obtained.

Also, as an alternative method, Λ, d, and H may be fixed and w/Λ may be adjusted. That is, fixing Λ, d, and H and modifying w/Λ is equivalent to modifying the effective thickness $H_{eff}$ of the light absorbing layer 104 at the grating 108 portion. The modification of the effective thickness $H_{eff}$ will cause a change in the effective refractive index of the light absorbing layer 104 at the grating 108 portion, and, accordingly, the propagation constant will be changed. Thus, for the reasons similar to those in the case described above, the incident angles $\theta_1^{TE}$ and $\theta_1^{TM}$ will coincide with each other for a particular value of the filling rate w/Λ, and the diffraction condition formula (3) will be held.

As a further alternative method, it may also be possible to adjust the pitch Λ of the grating 108 to satisfy the diffraction condition formula (3). Specifically, when the filling rate w/Λ of the grating 108 is fixed, the average refractive index of the light absorbing layer 104 is constant; accordingly, the propagation constants $\beta_{TE}$ and $\beta_{TM}$ of the light absorbing layer 104 will be substantially constant, irrespective of the pitch Λ of the grating 108, and, as a result, the right side of the formula (3) will be a constant value. Thus, by adjusting the pitch Λ (=2π/K) of the grating 108 under the condition that the filling rate w/Λ is fixed, the left side of the formula (3) (i.e., K) can be made to be equal to a fixed value of the right side, to thereby hold the formula (3).

As described above, first-order diffraction (N=1) by the grating 108 is considered in relation to FIG. 2; and, next, higher-order diffraction by the grating 108 will be considered. According to the formula (1), the conditions for allowing m-th order diffraction and n-th order diffraction with respect to the TE-polarized wave and the TM-polarized wave, respectively, are as follows:

$$k_{TE,Z}=-\beta_{TE}+m\cdot K(<0) \quad (4a)$$

$$k_{TM,Z}=-n\cdot K+\beta_{TM}(<0) \quad (4b).$$

Thus, assuming that $k_{TE,Z}=k_{TM,Z}$, the condition that the TE-polarized incident light and the TM-polarized incident light from the same direction are diffracted via the m-th order diffraction and the n-th order diffraction, toward the −Z direction and the +Z direction, respectively, is determined as $$K=(\beta_{TE}+\beta_{TM})/(m+n) \quad (5).$$

In this case, the incident angle $\theta_1^{TE}$ (=$\theta_1^{TM}$) of the incident light IL is given by the following formula:

$$\theta_1^{TE}=\sin^{-1}[(m\cdot n_{eff}^{TM}-n\cdot n_{eff}^{TE})/((m+n)\cdot n_{SiO2})] \quad (5)'.$$

The formula (5) may also be represented, by use of the effective refractive index, as shown below:

$$(\lambda/2\pi)\cdot K=(n_{eff}^{TE}+n_{eff}^{TM})/(m+n) \quad (6).$$

Thus, the light receiving element 100 may be formed to have a structure that satisfies the diffraction condition formulas (5) and (6). Note that, the lower the diffraction order, the larger the diffraction efficiency; accordingly, the light receiving sensitivity of the light receiving element 100 can be maximized when m=n=1, i.e., when the above formula (3) is held.

The incident angle of the incident light IL entering the light receiving element 200 from an actual MMF (multi-mode fiber) varies and spreads, and, thus, some angular components cannot be completely coupled with the slab waveguide (the light absorbing layer 204) by the grating 208. However, these angular components are diffracted by the grating 208 to angles that are substantially parallel to the slab waveguide. Therefore, even when an MMF is used at an input of the light receiving element 200, the above-described angular components of the incident light propagate toward the directions that are substantially parallel to the light absorbing layer 204. Thus, compared with a prior-art light receiving element without gratings, the distance along which the above component travels within the light absorbing layer is made longer, which contributes to an increase in the amount of absorption of light in the light absorbing layer 204, i.e., contributes to enhancement of the sensitivity of the light receiving element 200.

Figure 4:
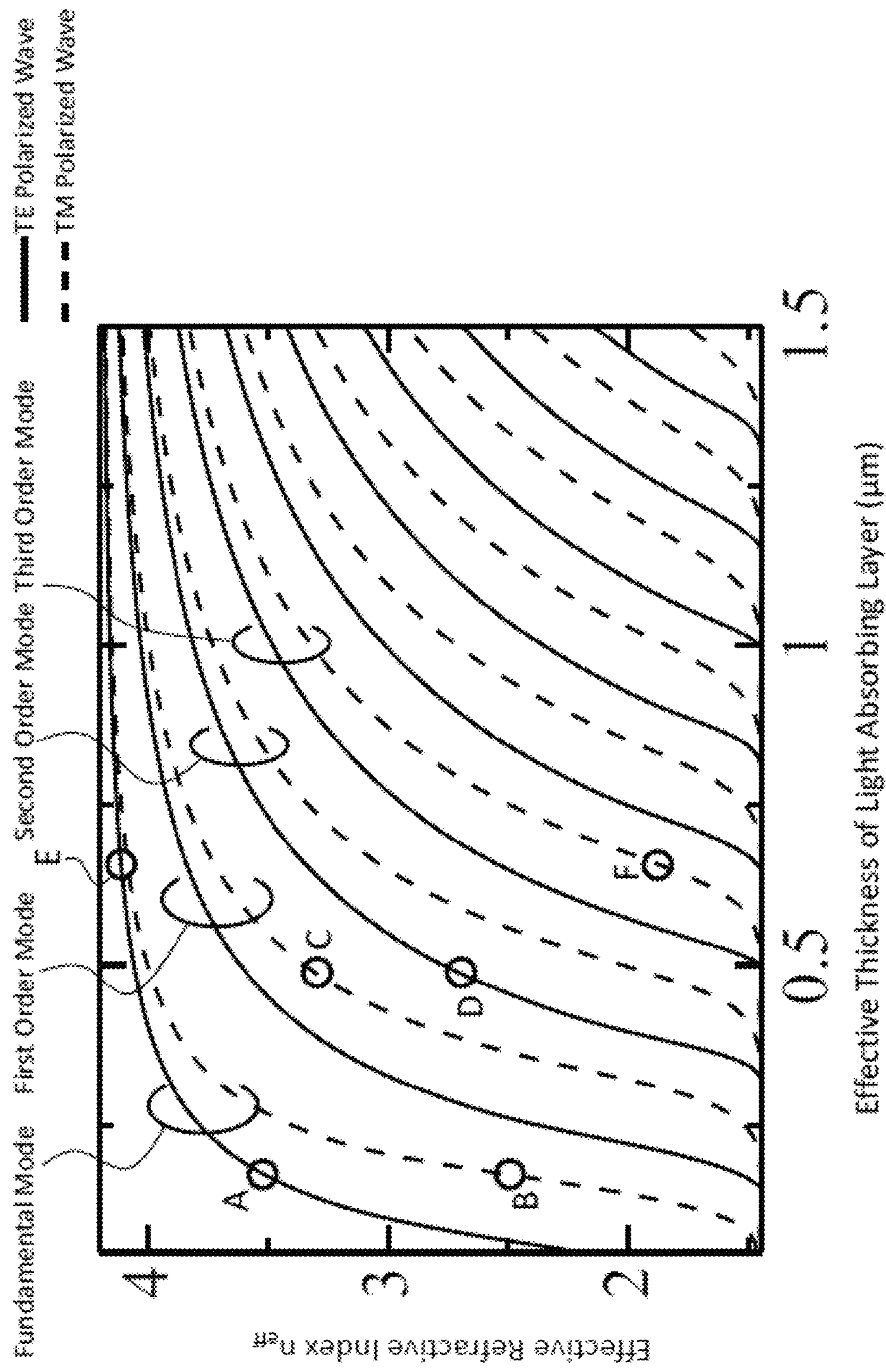
FIG. 4 is a graph showing relationship between effective thicknesses $H_{eff}$ of a light absorbing layer and effective refractive indices $n_{eff}$ of the light absorbing layer, with respect to some mode numbers for TE-polarized waves and TM-polarized waves.

Also, in the above description, the mode numbers for the TE-polarized propagation-mode light and the TM-polarized propagation-mode light in the light absorbing layer 104 are not mentioned explicitly; however, the TE-polarized propagation-mode light and the TM-polarized propagation-mode light in the light absorbing layer 104 may be in any one of the fundamental mode and higher-order modes thereof. Further, the mode number for the TE-polarized propagation-mode light and the mode number for the TM-polarized propagation-mode light may be identical to or different from each other. FIG. 4 is a graph showing relationship between effective thicknesses $H_{eff}$ of the light absorbing layer 104 and effective refractive indices $n_{eff}$ of the light absorbing layer 104, with respect to some mode numbers for the TE-polarized waves and the TM-polarized waves. The TE-polarized waves are shown by solid lines and the TM-polarized waves are shown by dashed lines. For example, the light receiving element 100 may be configured in such a manner that the effective refractive index indicated by symbol A for the TE-polarized fundamental-mode light and the effective refractive index indicated by symbol B for the TM-polarized fundamental-mode light (provided that the symbol B corresponds to the same $H_{eff}$ as that of the symbol A) collectively satisfy the diffraction condition formula (6). In this configuration, the incident light into the light receiving element 100 will be coupled with the TE-polarized fundamental-mode light propagating toward the −Z direction and the TM-polarized fundamental-mode light propagating toward the +Z direction in the light absorbing layer 104.

Similarly, for example, the light receiving element 100 may be configured in such a manner that the effective refractive index indicated by symbol C for the TM-polarized first-order-mode light and the effective refractive index indicated by symbol D for the TE-polarized second-order-mode light (provided that the symbol D corresponds to the same $H_{eff}$ as that of the symbol C) collectively satisfy the diffraction condition formula (6). In this configuration, the incident light into the light receiving element 100 will be coupled with the TE-polarized second-order-mode light propagating toward the −Z direction and the TM-polarized first-order-mode light propagating toward the +Z direction in the light absorbing layer 104. Further, for example, the light receiving element 100 may be configured in such a manner that the effective refractive index indicated by symbol E for the TE-polarized fundamental-mode light and the effective refractive index indicated by symbol F for the TM-polarized third-order-mode light (provided that the symbol F corresponds to the same $H_{eff}$ as that of the symbol E) collectively satisfy the diffraction condition formula (6). In this configuration, the incident light into the light receiving element 100 will be coupled with the TE-polarized fundamental-mode light propagating toward the −Z direction and the TM-polarized third-order-mode light propagating toward the +Z direction in the light absorbing layer 104.

Figure 5A:
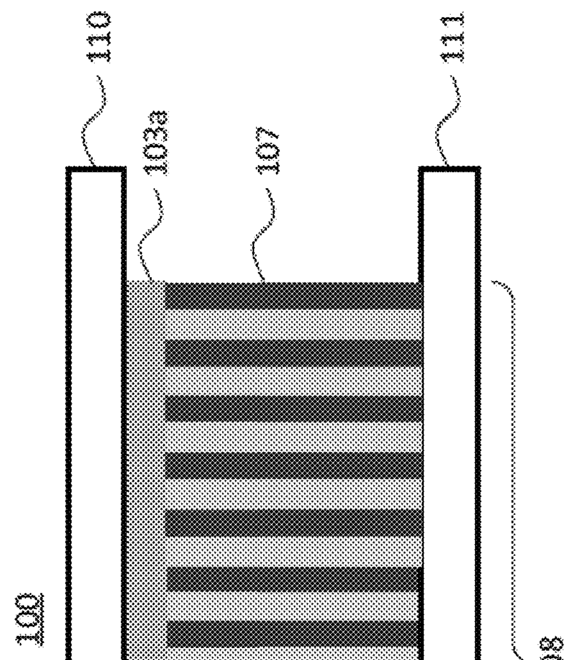
FIG. 5 shows top views of the light receiving elements according to the first embodiment.
Figure 5B:
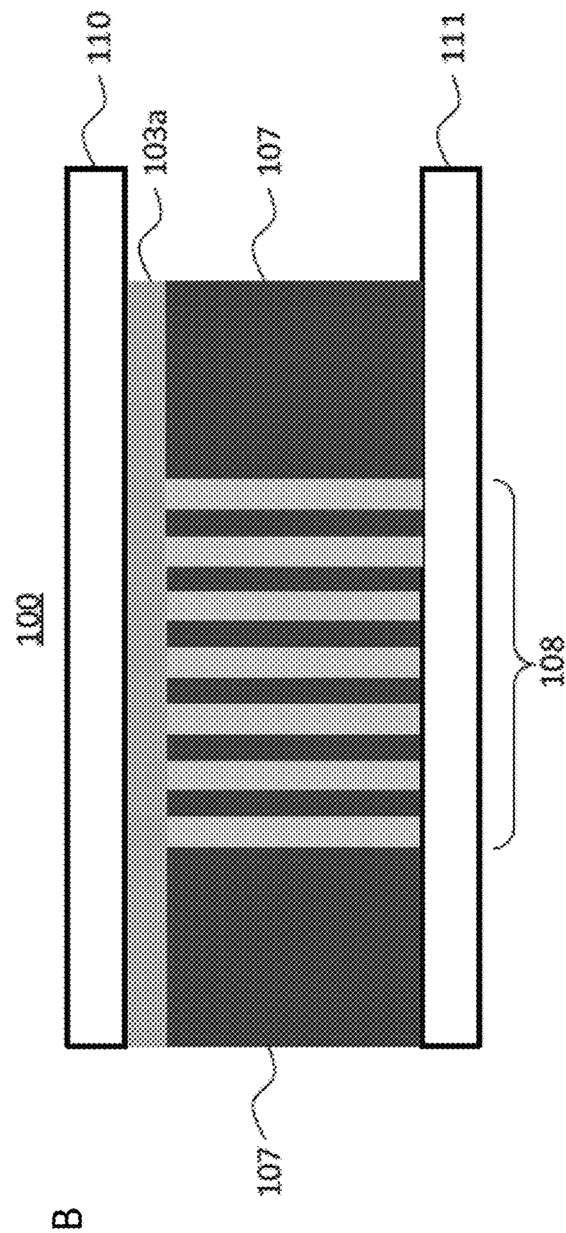

FIG. 5 shows top views of the light receiving elements 100. A contact area 103*a* of the P-type semiconductor layer is connected to the P-type semiconductor layer 103 shown in FIG. 1. A P-electrode 110 is connected to the contact area 103*a*. An N-electrode 111 is connected to the N-type semiconductor layer 105 shown in FIG. 1. As shown in FIG. 5(A), the grating 108 may be formed on the whole part of the light receiving surface of the light receiving element 100. As shown in FIG. 5(B), the grating 108 may be formed only on a part of the light receiving surface of the light receiving element 100. In the case that the incident angle of the incident light varies depending on the positions on the light receiving surface, the pitch Λ of the grating 108 may be modified according to the positions on the light receiving surface.

In FIG. 1, in place of one or both of the lower $SiO_2$ layer 102 and the upper $SiO_2$ layer 106, other material having a low refractive index may be used. For example, the upper $SiO_2$ layer 106 may be an air layer. It is preferable to have a large difference between the refractive indices of the lower $SiO_2$ layer 102 and the upper $SiO_2$ layer 106 (or other low-refractive-index material) and the refractive index of the light absorbing layer 104. The large difference in the refractive index enhances confinement of light within the light absorbing layer 104 at the slab waveguide and strengthens interaction between the light propagating through the grating 108 (the light absorbing layer 104) and the grating 108, and thus, increases the diffraction efficiency by the grating 108. Accordingly, an increased portion of the incident light can be diffracted toward the light absorbing layer 104, and therefore the sensitivity of the light receiving element 100 can be further improved.

Further, in FIG. 1, for reducing reflection of the incident light toward the light absorbing layer 104, a dielectric layer, comprising a single layer or multiple layers and having a medium refractive index between those of the upper $SiO_2$ layer 106 and the N-type semiconductor layer 105, may be introduced between the upper $SiO_2$ layer 106 and the N-type semiconductor layer 105.

Second Embodiment

Figure 6:
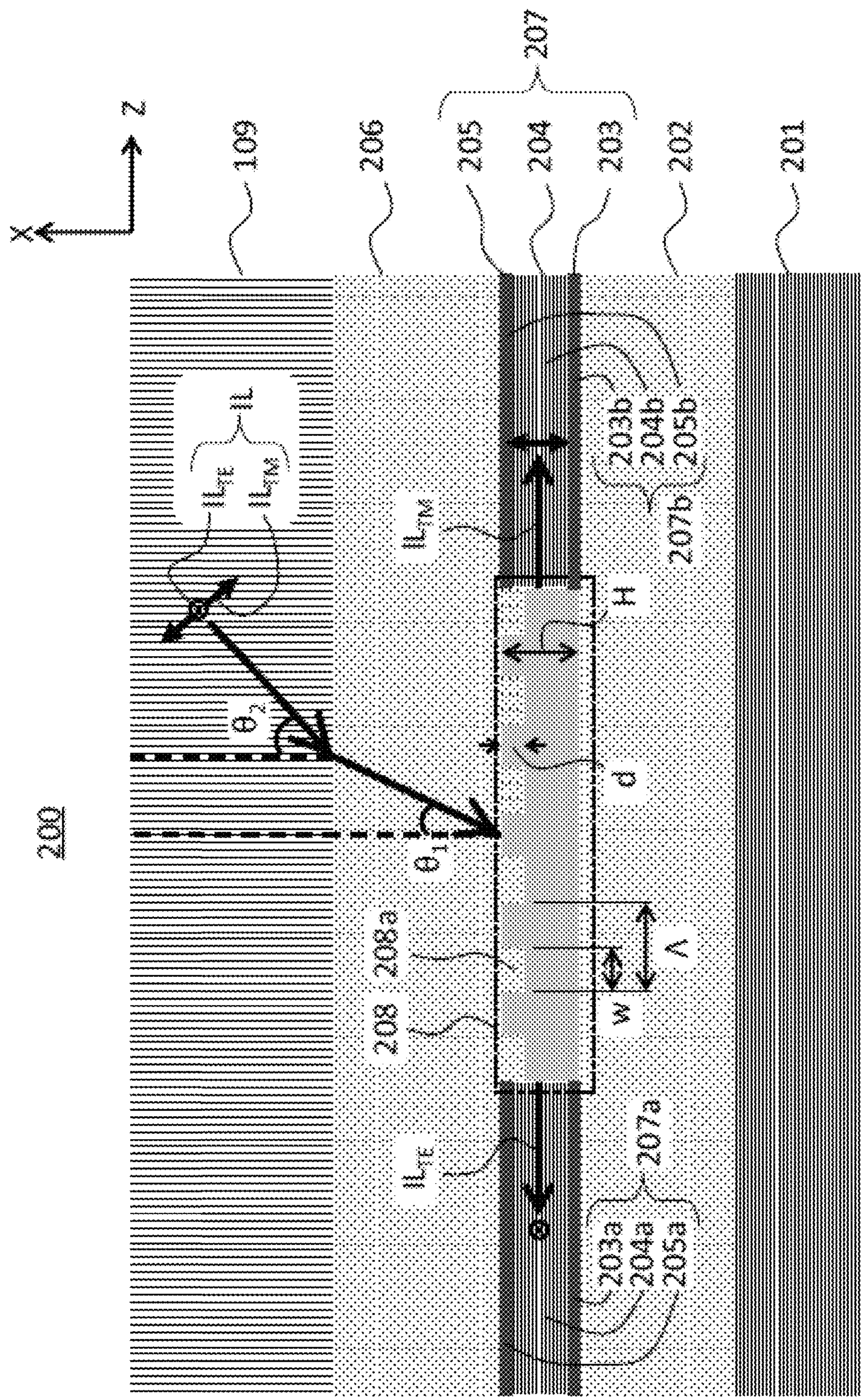
FIG. 6 is a cross-sectional view showing a structure of a light receiving element according to a second embodiment of the present invention.

FIG. 6 is a cross-sectional view showing a structure of a light receiving element 200 according to a second embodiment of the present invention. The light receiving element 200 comprises a substrate 201, a lower $SiO_2$ layer 202, a P-type semiconductor layer 203, a light absorbing layer 204, an N-type semiconductor layer 205, and an upper $SiO_2$ layer 206. The lower $SiO_2$ layer 202, the P-type semiconductor layer 203, the light absorbing layer 204, the N-type semiconductor layer 205, and the upper $SiO_2$ layer 206 are laminated on the substrate 201 in this order from the substrate 201 side. The substrate 201, the lower $SiO_2$ layer 202, and the upper $SiO_2$ layer 206 are the same as their corresponding components of the light receiving element 100 according to the first embodiment. In FIG. 6, similar to the case of FIG. 1, an X axis is defined to be in the perpendicular direction relative to the surface of the substrate 201, and a Z axis is defined to be in the parallel direction (the lateral direction in the figure) relative to the surface of the substrate 201.

The light receiving element 200 comprises a PIN structure 207 comprising the P-type semiconductor layer 203, the light absorbing layer 204, and the N-type semiconductor layer 205. The PIN structure 207 comprises a first PIN structure 207*a* located at the −Z direction side and a second PIN structure 207*b* located at the +Z direction side. The first PIN structure 207*a* comprises a first P-type semiconductor layer 203*a*, a first light absorbing layer 204*a*, and a first N-type semiconductor layer 205*a*, and the second PIN structure 207*b* comprises a second P-type semiconductor layer 203*b*, a second light absorbing layer 204*b*, and a second N-type semiconductor layer 205*b*.

The light receiving element 200 comprises a grating 208 formed in a region surrounded by the lower $SiO_2$ layer 202, the upper $SiO_2$ layer 206, the first PIN structure 207*a*, and the second PIN structure 207*b*. The grating 208 is an uneven structure wherein a plurality of grooves 208*a*, each having a depth d and a width w, are formed on its surface at the upper $SiO_2$ layer 206 side in such a manner that the grooves 208*a* are aligned with a pitch (a periodicity) Λ along the Z-axis direction. The grating 208 is formed by use of material different from that used for the light absorbing layer 204. For example, the grating 208 may be formed by use of silicon (Si) or silicon dioxide ($SiO_2$).

The operation of the light receiving element 200 is basically the same as that of the light receiving element 100 according to the first embodiment. Thus, the TE-polarized incident light $IL_{TE}$ entering the grating 208 at an incident angle of $\theta_1$ is diffracted toward a −Z direction by the grating 208. That is, the propagation direction of the TE-polarized incident light $IL_{TE}$ after diffraction is the −Z direction. The TE-polarized incident light $IL_{TE}$ diffracted by the grating 208 travels across the grating 208 toward the −Z direction, and is coupled with TE-polarized propagation-mode light in the first light absorbing layer 204*a* (or a slab waveguide comprising the first light absorbing layer 204*a* as a core layer) to propagate toward the −Z direction through the first light absorbing layer 204*a*. Meanwhile, the TM-polarized incident light $IL_{TM}$ entering the grating 208 at an incident angle of $\theta_1$ is diffracted toward a +Z direction by the grating 208. That is, the propagation direction of the TM-polarized incident light $IL_{TM}$ after diffraction is the +Z direction. The TM-polarized incident light $IL_{TM}$ diffracted by the grating 208 travels across the grating 208 toward the +Z direction, and is coupled with TM-polarized propagation-mode light in the second light absorbing layer 204*b* (or a slab waveguide comprising the second light absorbing layer 204*b* as a core layer) to propagate toward the +Z direction through the second light absorbing layer 204*b*.

As described above, in the second embodiment, the light receiving element 200 is also a surface-type light receiving element having a structure where light is incident from the upper side onto an area of the light receiving surface. However, the incident light is diffracted by the grating 208 such that both the TE-polarized and the TM-polarized light propagate within the surfaces of the light absorbing layer 204 (the first light absorbing layer 204*a* and the second light absorbing layer 204*b*) toward specific directions that are parallel to the light absorbing layer 204 and are opposite to each other. Thus, the length for interaction between the light and the light absorbing layer 204 is made longer, and thereby carriers can be generated at high efficiency from both the TE-polarized and the TM-polarized light. As a result, the light receiving sensitivity, i.e., photoelectric conversion efficiency, of the light receiving element 200 can be improved. Further, since the length of the light absorbing layer 204 (the first light absorbing layer 204*a* and the second light absorbing layer 204*b*) along the Z-axis direction is shorter than that in the case of the first embodiment, the capacitance formed by the PIN structure 207 is reduced. Thus, in addition to enhancement of the sensitivity of the light receiving element 200, a high-speed operation can also be realized as a result of lowering of the CR time constant.

Figure 7A:
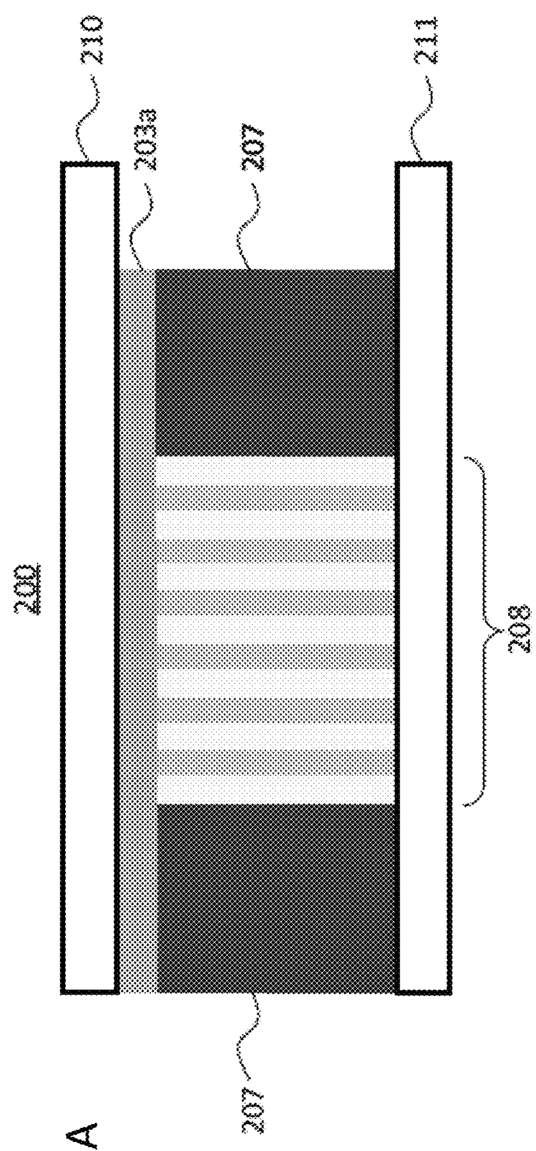
FIG. 7 shows top views of the light receiving elements according to the second embodiment.
Figure 7B:
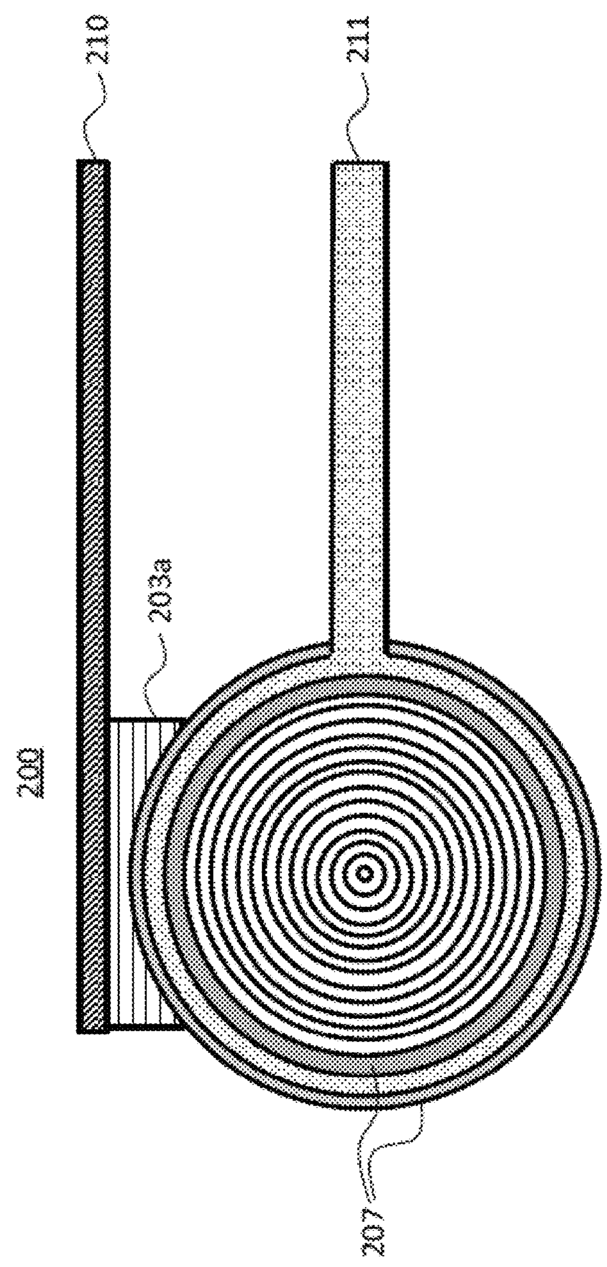

FIG. 7 shows top views of the light receiving elements 200. A contact area 203*a* of the P-type semiconductor layer is connected to the P-type semiconductor layer 203 shown in FIG. 6. A P-electrode 210 is connected to the contact area 203*a*. An N-electrode 211 is connected to the N-type semiconductor layer 205 shown in FIG. 6. As shown in FIG. 7(A), the grating 208 may be formed, in a one-dimensional manner, across the light receiving surface of the light receiving element 200. As shown in FIG. 7(B), the grating 208 may be formed to have a circular shape, on the light receiving surface of the light receiving element 200. In the configuration shown in FIG. 7(B), although the grating 208 has a circular shape as a whole, the grating 208 is formed as a one dimensional grating when its local part, i.e., a part within a range between minute angles, is extracted and viewed.

Figure 8:
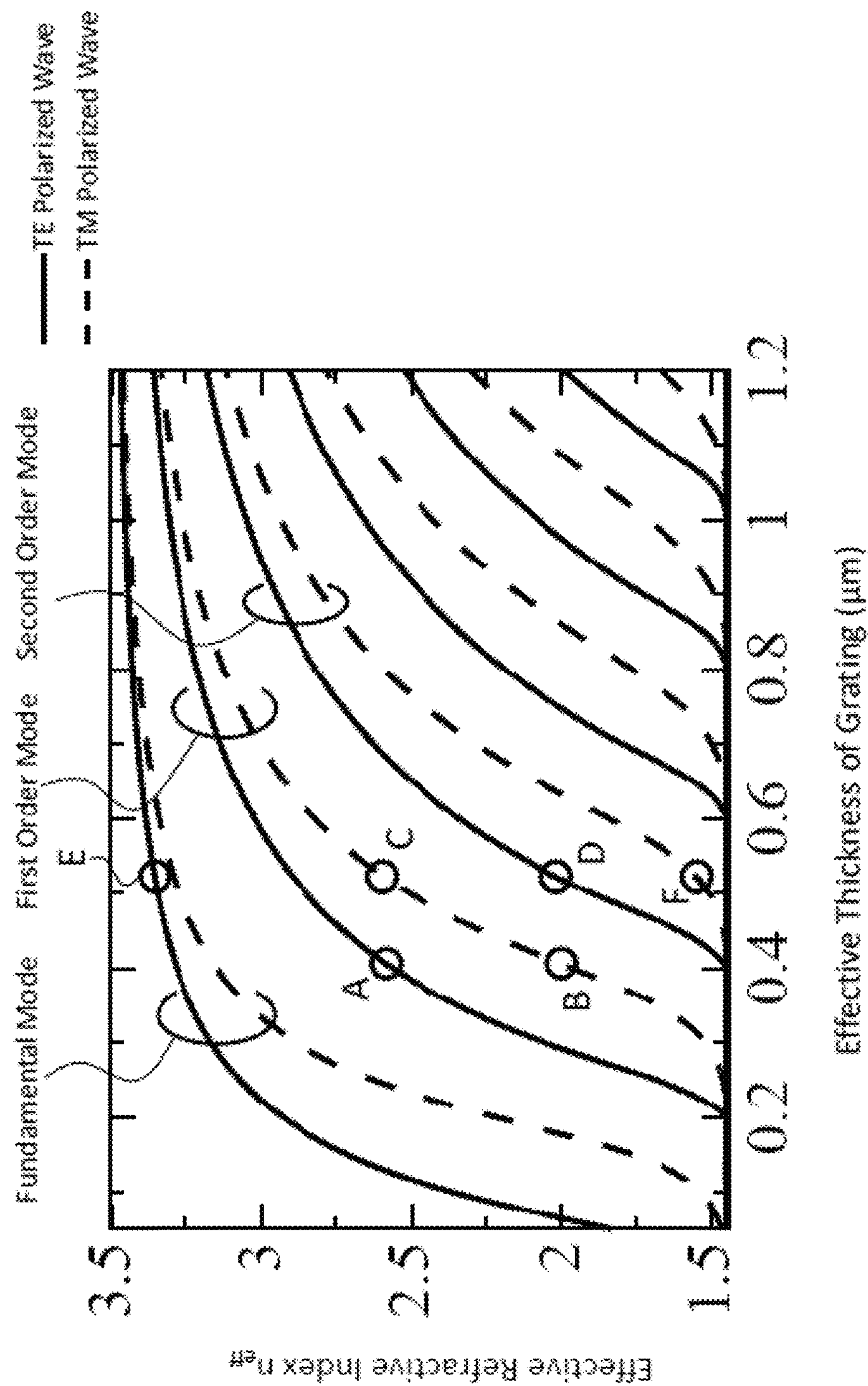
FIG. 8 is a graph showing relationship between effective thicknesses $H_{eff}$ of a grating and effective refractive indices $n_{eff}$ of the grating, with respect to some mode numbers for TE-polarized waves and TM-polarized waves.

FIG. 8 is a graph showing relationship between effective thicknesses $H_{eff}$ of the grating 208 and effective refractive indices $n_{eff}$ of the grating 208, with respect to some mode numbers for the TE-polarized waves and the TM-polarized waves. The TE-polarized waves are shown by solid lines and the TM-polarized waves are shown by dashed lines. Similar to those shown in FIG. 4 for the first embodiment, symbols A and B indicate that the incident light into the light receiving element 200 is coupled with the TE-polarized first-order-mode light propagating through the first light absorbing layer 204*a* toward the −Z direction and the TM-polarized first-order-mode light propagating through the second light absorbing layer 204*b* toward the +Z direction. Similarly, symbols C and D indicate that the incident light into the light receiving element 200 is coupled with the TM-polarized first-order-mode light propagating through the second light absorbing layer 204*b* toward the +Z direction and the TE-polarized second-order-mode light propagating through the first light absorbing layer 204*a* toward the −Z direction; and symbols E and F indicate that the incident light into the light receiving element 200 is coupled with the TE-polarized fundamental-mode light propagating through the first light absorbing layer 204*a* toward the −Z direction and the TM-polarized second-order-mode light propagating through the second light absorbing layer 204*b* toward the +Z direction.

Third Embodiment

Figure 9:
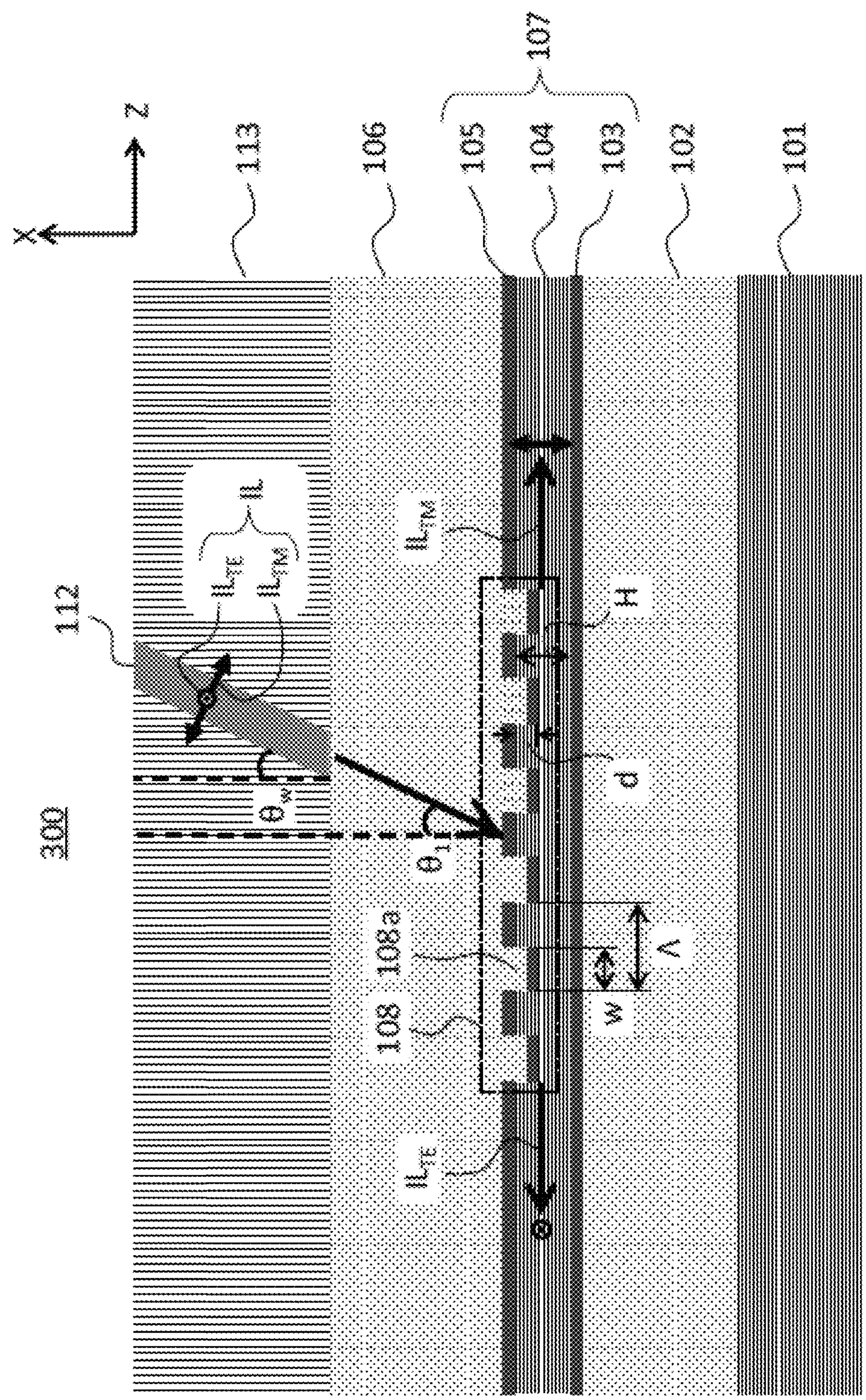
FIG. 9 is a cross-sectional view showing a structure of a light receiving element according to a third embodiment of the present invention.

FIG. 9 is a cross-sectional view showing a structure of a light receiving element 300 according to a third embodiment of the present invention. In addition to the components included in the light receiving element 100 according to the first embodiment, the light receiving element 300 further comprises an optical waveguide 112. The optical waveguide 112 is formed on the upper $SiO_2$ layer 106 in such a manner that the optical axis of the optical waveguide 112 is slanted with respect to the surface formed by the light absorbing layer 104. For example, the optical waveguide 112 may be configured to have a waveguide structure that comprises a core (112) comprising a high refractive index resin and a cladding comprising a low refractive index resin 113 that fills the space around the core. In the case that the incident angle $\theta_1^{TE}$ ($=\theta_1^{TM}$) associated with the grating 108 is that given by the above formulas (3)' or (5)', the tilting angle $\theta_w$ of the optical waveguide 112 is set to an angle that satisfies the Snell's law, namely, $n_w \sin(\theta_w)=n_{SiO2}\cdot\sin(\theta_1^{TE})$, where $n_w$ is the effective refractive index of the optical waveguide 112. According to the above configuration, the incident angle of the incident light IL can be fixed to an angle that satisfies the diffraction condition for the grating 108.

In the case that the optical waveguide 112 is a multimode waveguide, the effective refractive index of the optical waveguide 112 varies with its modes. In such a case, the effective refractive index $n_w$ of the optical waveguide 112 may be defined, for example, by the following formula:

$$n_w=\Sigma(P_i\cdot n_{wi})/\Sigma P_i,$$

where $n_{wi}$ denotes an effective refractive index of the optical waveguide 112 for mode i, and $P_i$ denotes the optical intensity of the mode i in the optical waveguide 112. Note that the symbol Σ represents a sum of all of the modes i. The definition of the effective refractive index $n_w$ in the case that the optical waveguide 112 is a multimode waveguide is not limited to the above formula. For example, an $n_{wi}$ that corresponds to the maximum optical intensity $P_i$ may be used as the effective refractive index $n_w$ of the optical waveguide 112.

Note that an optical waveguide similar to the optical waveguide 112 may be included in the components of the light receiving element 200 according to the second embodiments.

Although the present invention is described with reference to some embodiments, the present invention is not limited to the embodiments disclosed herein, and various modification of the embodiments can be made without departing from the scope of the present invention.

REFERENCE SIGNS LIST

100 Light receiving element
101 Substrate
102 Lower $SiO_2$ layer
103 P-type semiconductor layer
104 light absorbing layer
105 N-type semiconductor layer
106 Upper $SiO_2$ layer

107 PIN structure
108 Grating
109 Air layer
110 P-electrode
111 N-electrode
112 Optical waveguide

The invention claimed is:

1. A photodetector comprising:

a photoelectric conversion layer that photoelectrically converts light to carriers; and a diffraction element for converting an optical path of first polarized light that is incident in a slanted direction relative to a plane formed by the photoelectric conversion layer, such that the first polarized light propagates along the photoelectric conversion layer toward a first direction, and for converting an optical path of second polarized light that is incident from the same slanted direction as the first polarized light and is orthogonally polarized relative to the first polarized light, such that the second polarized light propagates along the photoelectric conversion layer toward a second direction that is opposite to the first direction.

2. The photodetector according to claim 1, wherein the following formula $$K=(\beta_1+\beta_2)/(m+n)$$

is satisfied, where K denotes the magnitude of a reciprocal lattice vector of the diffraction element, $\beta_1$ denotes a propagation constant of the first polarized light in the photoelectric conversion layer, $\beta_2$ denotes a propagation constant of the second polarized light in the photoelectric conversion layer, m denotes a diffraction order of the first polarized light diffracted by the diffraction element, wherein m is a positive integer, and n denotes a diffraction order of the second polarized light diffracted by the diffraction element, wherein n is a positive integer.

3. The photodetector according to claim 1, wherein the magnitude of a reciprocal lattice vector of the diffraction element is equal to an average value of a propagation constant of the first polarized light in the photoelectric conversion layer and the propagation constant of the second polarized light in the photoelectric conversion layer.

4. The photodetector according to claim 1, wherein the diffraction element is formed in the photoelectric conversion layer.

5. The photodetector according to claim 1, wherein the diffraction element is formed on the same plane as the photoelectric conversion layer, wherein the region in which the diffraction element is formed is different from the region in which the photoelectric conversion layer is formed.

6. The photodetector according to claim 5, wherein the photoelectric conversion layer comprises a first photoelectric conversion layer that photoelectrically converts the first polarized light propagating toward the first direction, and a second photoelectric conversion layer that photoelectrically converts the second polarized light propagating toward the second direction.

7. The photodetector according to claim 1, further comprising an optical waveguide that stands slantedly with respect to a plane constituted by the photoelectric conversion layer, for guiding the first polarized light and the second polarized light into the diffraction element.

8. The photodetector according to claim 7, wherein the optical waveguide is slanted with respect to the plane constituted by the photoelectric conversion layer such that an incident angle θ of the first polarized light and the second polarized light onto the diffraction element satisfies the following formula $$\theta=\sin^{-1}[(m\cdot n_{eff2}-n\cdot n_{eff1})/((m+n)\cdot n_w)],$$

where $n_{eff1}$ denotes an effective refractive index of the photoelectric conversion layer with respect to the first polarized light, $n_{eff2}$ denotes an effective refractive index of the photoelectric conversion layer with respect to the second polarized light, and $n_w$ denotes an effective refractive index of the optical waveguide.

* * * * *